US 7,855,983 B2

(12) United States Patent
Knecht et al.

(10) Patent No.: US 7,855,983 B2
(45) Date of Patent: *Dec. 21, 2010

(54) TIME DIVISION DUPLEX FRONT END MODULE

(75) Inventors: Thomas A. Knecht, Dundee, IL (US); Glen Reeser, Palatine, IL (US)

(73) Assignee: CTS Corporation, Elkhart, IN (US)

(*) Notice: Subject to any disclaimer, the term of this patent is extended or adjusted under 35 U.S.C. 154(b) by 197 days.

This patent is subject to a terminal disclaimer.

(21) Appl. No.: 12/214,129

(22) Filed: Jun. 17, 2008

(65) Prior Publication Data

US 2008/0316948 A1 Dec. 25, 2008

Related U.S. Application Data

(63) Continuation-in-part of application No. 11/452,800, filed on Jun. 14, 2006, and a continuation-in-part of application No. 11/823,735, filed on Jun. 28, 2007.

(60) Provisional application No. 60/936,201, filed on Jun. 19, 2007.

(51) Int. Cl.
   *H04L 5/14* (2006.01)
   *H04B 1/38* (2006.01)
(52) U.S. Cl. .................. 370/280; 455/349; 455/561; 370/294
(58) Field of Classification Search .............. None
   See application file for complete search history.

(56) References Cited

U.S. PATENT DOCUMENTS

| 4,792,939 A | 12/1988 | Hikita et al. |
| 4,811,421 A | 3/1989 | Havel et al. |
| 5,228,074 A | 7/1993 | Mizikovsky |
| 5,333,176 A | 7/1994 | Burke et al. |
| 5,404,584 A | 4/1995 | Bobbitt et al. |

(Continued)

FOREIGN PATENT DOCUMENTS

EP 0 736 978 10/1996

(Continued)

OTHER PUBLICATIONS

Kolbe, Werner, PCT International Search Report mailed Sep. 10, 2008 re: International Application No. PCT/US2008/007542 filed Jun. 17, 2008.

(Continued)

*Primary Examiner*—Min Jung
(74) *Attorney, Agent, or Firm*—Daniel J. Deneufbourg

(57) ABSTRACT

An RF module adapted for direct surface mounting to the top surface of the front end of the motherboard of a wireless base station such as, for example, a femtocell. The module comprises a printed circuit board having a plurality of direct surface mounted electrical components defining respective signal transmit and receive sections for RF signals. The signal transmit section is defined by at least a power amplifier, a coupler, and a lowpass filter. The signal receive section is defined by at least a receive bandpass filter and a low-noise amplifier. A lid covers selected ones of the electrical components except for at least the power amplifier. An RF switch is located between and interconnects the respective transmit and receive sections to an antenna pin.

11 Claims, 3 Drawing Sheets

U.S. PATENT DOCUMENTS

| | | | |
|---|---|---|---|
| 5,525,942 A | | 6/1996 | Horii et al. |
| 5,838,551 A | | 11/1998 | Chan |
| 5,903,820 A | | 5/1999 | Hagström |
| 6,125,138 A | * | 9/2000 | Kumagai .................... 375/219 |
| 6,222,503 B1 | | 4/2001 | Gietema et al. |
| 6,236,840 B1 | * | 5/2001 | Aihara et al. ................. 455/83 |
| 6,310,705 B1 | | 10/2001 | Lee et al. |
| 6,816,714 B2 | | 11/2004 | Toncich |
| 6,961,544 B1 | | 11/2005 | Hagström |
| 2001/0043130 A1 | | 11/2001 | Nagamori et al. |
| 2003/0100287 A1 | | 5/2003 | Kordjani et al. |
| 2003/0143971 A1 | | 7/2003 | Hongo et al. |
| 2004/0136335 A1 | | 7/2004 | Oh-Yang et al. |
| 2004/0183645 A1 | * | 9/2004 | Takaya et al. ............... 336/234 |
| 2004/0185795 A1 | * | 9/2004 | Shamsaifar et al. ........... 455/83 |
| 2004/0240420 A1 | | 12/2004 | Nakai |
| 2005/0104685 A1 | | 5/2005 | Kuroki et al. |
| 2005/0266803 A1 | | 12/2005 | Dinur et al. |
| 2006/0058000 A1 | * | 3/2006 | Block et al. ................. 455/333 |
| 2006/0286959 A1 | | 12/2006 | Knecht et al. |
| 2008/0153451 A1 | | 6/2008 | Knecht et al. |
| 2008/0169349 A1 | * | 7/2008 | Suzuki et al. ............... 235/492 |

FOREIGN PATENT DOCUMENTS

| | | |
|---|---|---|
| WO | WO 93/14573 | 7/1993 |
| WO | WO 01/05048 | 1/2001 |
| WO | WO 2005/009099 | 1/2005 |
| WO | WO 2006/138667 A2 | 12/2006 |
| WO | WO 2006/138667 A3 | 12/2006 |

OTHER PUBLICATIONS

Kolbe, Werner, PCT Written Opinion of the International Searching Authority mailed Sep. 10, 2008 re: International Application No. PCT/US2008/007542 filed: Jun. 17, 2008.

Aquilani, Dario, PCT International Search Report mailed Dec. 11, 2007 re: International Application No. PCT/US2007/015031 filed Jun. 28, 2007.

Aquilani, Dario, PCT Written Opinion of the International Searching Authority mailed Dec. 11, 2007 re: International Application No. PCT/US2007/015031 filed Jun. 28, 2007.

Kelly, Derek, PCT International Search Report mailed May 7, 2007 re: International Application No. PCT/US2006/023655 filed Jun. 16, 2006.

Kelly, Derek, PCT Written Opinion of the International Searching Authority mailed May 7, 2007 re: International Application No. PCT/US2006/023655 filed Jun. 16, 2006.

* cited by examiner

TIME DIVISION DUPLEX FRONT END MODULE

CROSS-REFERENCE TO RELATED APPLICATIONS

This application is a continuation-in-part non-provisional application which claims the benefit of U.S. application Ser. No. 11/452,800 filed on Jun. 14, 2006; U.S. application Ser. No. 11/823,735 filed on Jun. 28, 2007; and U.S. Provisional Application Ser. No. 60/936,201, filed on Jun. 19, 2007, the disclosures of which are explicitly incorporated herein by reference as are all references cited therein.

FIELD OF THE INVENTION

The invention relates to a module and, more particularly, to a time division duplex radio frequency (RF) module adapted for use on the front end of a cellular base station such as, for example, a WiMax wireless femtocell communication base station.

BACKGROUND OF THE INVENTION

There are currently four types of cellular/wireless communication base stations or systems in use today for the transmission and reception of W-CDMA, UMTS, and WiMax based cellular/wireless communication signals, i.e., macrocells, microcells, picocells, and femtocells. Macrocells, which today sit atop cellular/wireless towers, operate at approximately 1,000 watts. The coverage of macrocells is in miles. Microcells, which are smaller in size than macrocells, are adapted to sit atop telephone poles, for example, and the coverage is in blocks. Microcells operate at approximately 20 watts. A smaller yet microcell requires about 5 watts of power to operate. Picocells are base stations approximately 8"×18" in size, are adapted for deployment inside buildings such as shopping malls, office buildings or the like, and output about 0.25 watts of power. The coverage of a picocell is about 50 yards. Femtocells output about 0.10 watts of power and are used in the home.

All of the picocells and microcells in use today include a "motherboard" upon which various electrical components have been individually mounted by the customer. A front end portion of the motherboard (i.e., the RF transceiver section thereof located roughly between the picocell antenna and mixers thereof) is currently referred to in the art as the "node B local area front end," i.e., a portion of the femtocell, picocell, or microcell on which all the radio frequency control electrical components such as, for example, the filters, amplifiers, couplers, inductors and the like have been individually mounted and interconnected.

While the configuration and structure of the current motherboards has proven satisfactory for most applications, certain disadvantages associated with the current front end RF configuration thereof include performance, the costs associated with a customer's placement of individual RF components onto the motherboard during assembly, and the space which such RF components occupy on such motherboards.

There thus remains the need for increased RF component performance and a reduction in both the cost of these motherboards and the space occupied by the RF components on such motherboards. The present invention provides a compact front end RF component module particularly adapted and structured for the transmission and reception of WiMax signals which addresses and solves the above-identified needs.

SUMMARY OF THE INVENTION

The present invention relates generally to a radio frequency (RF) module adapted for use on the front end of a wireless base station such as a femtocell, picocell, or microcell base station. The RF module includes a printed circuit board/substrate having a plurality of electrical components mounted directly thereto and adapted to allow for the transmission and reception of wireless signals between the antenna of the cell on one end and the respective input and output pads on the motherboard of the cell at the other end.

A first section on the printed circuit board/substrate defines a transmit path for RF signals and includes at least the following electrical components mounted thereon: a power amplifier, a coupler and a lowpass filter.

The module includes a second section on the printed circuit board/substrate which defines a receive path for RF signals and includes at least the following electrical components mounted thereon: a receive bandpass filter and a low-noise amplifier.

An RF single pole double throw (SPDT) switch is located between and interconnects the respective transmit (Tx) and receive (Rx) sections to an antenna pin.

A lid is adapted to cover selected ones of the electrical components mounted to the printed circuit board. At least the power amplifier is preferably located outside the lid. A plurality of through-holes or vias located below the amplifier are adapted to define a sink for heat created by the power amplifier.

Other advantages and features of the present invention will be more readily apparent from the following detailed description of the preferred embodiment of the invention, the accompanying drawings, and the appended claims.

BRIEF DESCRIPTION OF THE DRAWINGS

These and other features of the invention can best be understood by the following description of the accompanying FIGURES as follows.

DETAILED DESCRIPTION OF THE PREFERRED EMBODIMENT

While this invention is susceptible to embodiments in many different forms, this specification and the accompanying FIGURES disclose only one preferred simplified embodiment as an example of the present invention which is adapted for use in a picocell. The invention is not intended, however, to be limited to the embodiment so described and extends, for example, to femtocells and microcells as well.

Figure 1:
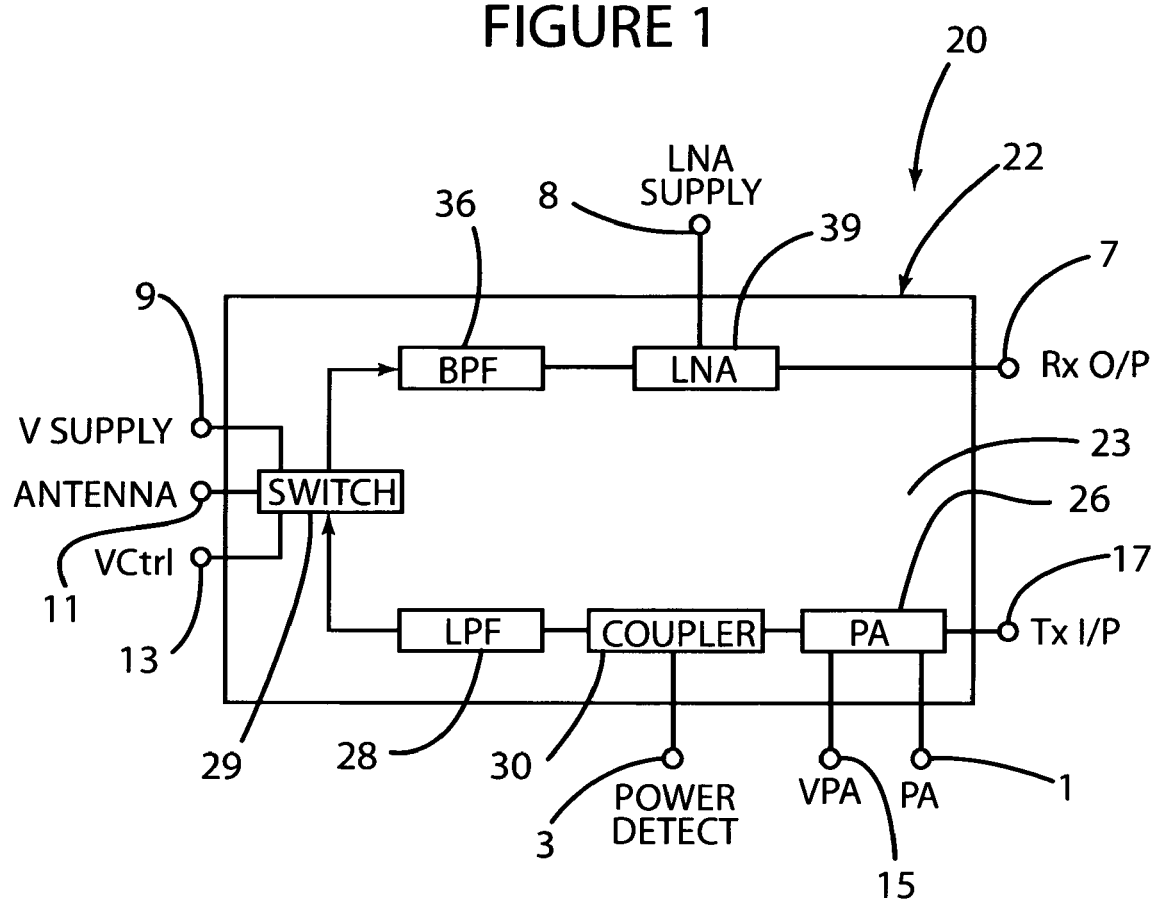
FIG. 1 is a simplified block diagram depicting the flow of wireless signals being transmitted and received through the various RF components defining the time division duplex front end module of the present invention.

FIG. 1 is a simplified block diagram of the RF (radio frequency) front end module, generally designated 20, constructed in accordance with the present invention and adapted for use in connection with a wireless base station including, for example, a WiMax femtocell, picocell, or microcell.

As described in more detail below, the TDD (time division duplex) WiMax front end module 20 utilizes filtering with two filters: a receive Rx bandpass filter 36, and a transmit Tx lowpass filter 28. The module 20 also includes a power amplifier (PA) 26, a low-noise amplifier (LNA) 39 and other appropriate RF components. In the embodiment shown, all of the appropriate RF components are of the discrete surface-mountable type.

Module 20 is adapted to replace all of the discrete RF components that would be typically individually mounted and used in a WiMax Node B local area front end. Module 20 allows customers to select different values for receiver sensitivity, selectivity, and output power. Moreover, module 20 is RoHS compliant and lead-free. Some of the features of the module 20 as introduced above and described in more detail below include the scalable power amplifier 26 capable of delivering about 25 dBm at the antenna port; the above-identified filters 28 and 36 offering excellent isolation and harmonic suppression; and the low noise amplifier 39.

Table 1 below summarizes the proposed operational parameters and characteristics of the time division duplex front end module of the present invention:

TABLE 1

| Typical Specifications | |
|---|---|
| Nominal channel bandwidth: | 20 MHz |
| Modulation: | 64 QAM |
| Antenna switching speed | <1 usec |
| TRANSMIT | |
| Frequency range | 2496-2692 MHz |
| PA supply voltage | 5 V |
| PA current drain | 650 mA |
| Power @ antenna port | 25 dBm |
| EVM @ 25 dBm | 2.5% |
| Tx gain | 23 dB |
| RECEIVE | |
| Frequency range | 2496-2692 MHz |
| LNA supply voltage | 3.3 V |
| LNA current drain | 15 mA |
| Noise figure | 2.2 dB |
| IIP3 | 3 dBm |
| Rx gain | 14 dB |
| Attenuation (.1-1796 MHz) | −45 dB |
| 2396 MHz | −27 dB |
| 2790 MHz | −27 dB |
| Temp range: | −40° C.-85° C. |

Referring now in particular to FIG. 1, it is understood that module 20 is defined by a plurality of RF electrical components and pins associated with a substrate 22 and defining respective RF signal transmit and receive sections or paths. Initially, and as shown in FIG. 1, the lower RF transmit section or path of module 20 includes a first Tx (transmit) signal input pin 17 adapted to be coupled to a corresponding Tx (transmit) signal pad on the motherboard (not shown) of a picocell or microcell. Pin 17 in turn is coupled to a Tx PA (transmit power amplifier) 26 which, in turn, is coupled to a coupler 30 which, in turn, is coupled to a Tx LPF (transmit low pass filter) 28.

VPA (power amplifier supply voltage) is adapted to be supplied to power amplifier 26 through pin 15. PA bias is adapted to be measured through pin 1 coupled to power amplifier 26. In accordance with the present invention, a portion of the transmit signal is split off from coupler 30 and passed to a power detect pin 3. The Tx LPF 28 is, in turn, coupled to an RF SPDT (single pole double throw) switch 29. The switch 29, in turn, is coupled to an antenna via antenna pin 11. Voltage is supplied to the module 20 through the V supply (voltage supply) pin 9 coupled to switch 29. The voltage supplied to module 20 is controlled via and through $V_{CTRL}$ (voltage control) pin 13, also coupled to the switch 29. In another embodiment, the $V_{CTRL}$ pin 13 can be omitted and the switching function can be facilitated with the use of only one voltage input pin (i.e., pin 9).

All of the pins associated with the substrate 22, including antenna pin 11, extend between the top and bottom surfaces of the module 20 and are adapted to be direct surface mounted into coupling relationship with corresponding pads (not shown) of a picocell or microcell such as, for example, the antenna pad thereof to allow for the transmission of the signals which have passed through the RF signal transmission section of module 20.

Referring to FIGS. 1-4, it is thus understood that the Tx (transmit) RF wireless signal is adapted to travel from the femtocell/picocell/microcell motherboard into and up through the substrate 22 of module 20 via Tx input pin 17 extending between the lower and upper substrate surfaces, and then from Tx input pin 17 into and through power amplifier 26, coupler 30, lowpass filter 28, switch 29, antenna pin 11, and then back down through the substrate 22 via antenna pin 11 extending between the upper and lower substrate surfaces and into the motherboard antenna pad in direct surface contact with module antenna pin 11.

The top receive section or path of the signals being received (i.e., Rx signals) from the femtocell, picocell, or microcell antenna (not shown) and transmitted through the module 20 will now be described also with reference to FIGS. 1-4 which shows the Rx signal being transmitted and passed in a left to right, clockwise direction from the picocell or microcell antenna (not shown) through the module antenna pin 11 and then initially through the switch 29.

Switch 29 is, of course, adapted and structured as known in the art to allow the same to switch from the passage of Tx signals out of the module 20 through the antenna pin 11 to the passage of Rx signals into and through the module 20 from the antenna pin 11. Thus, and as shown in FIG. 1, the Rx signal is adapted to pass and travel in a general clockwise direction through the switch 29 and into Rx bandpass filter 36 and LNA (low noise amplifier) 39. Voltage is supplied to low noise amplifier 39 via LNA supply voltage pin 8 coupled thereto.

From the low-noise amplifier 39, the Rx signal then passes through Rx O/P (output) signal pin 7 which, in turn, is adapted to extend between the front and back surfaces 23 and 27 of the module 20 for direct surface coupling to the corresponding Rx output signal pad (not shown) on the motherboard of the picocell or microcell.

Figure 2:
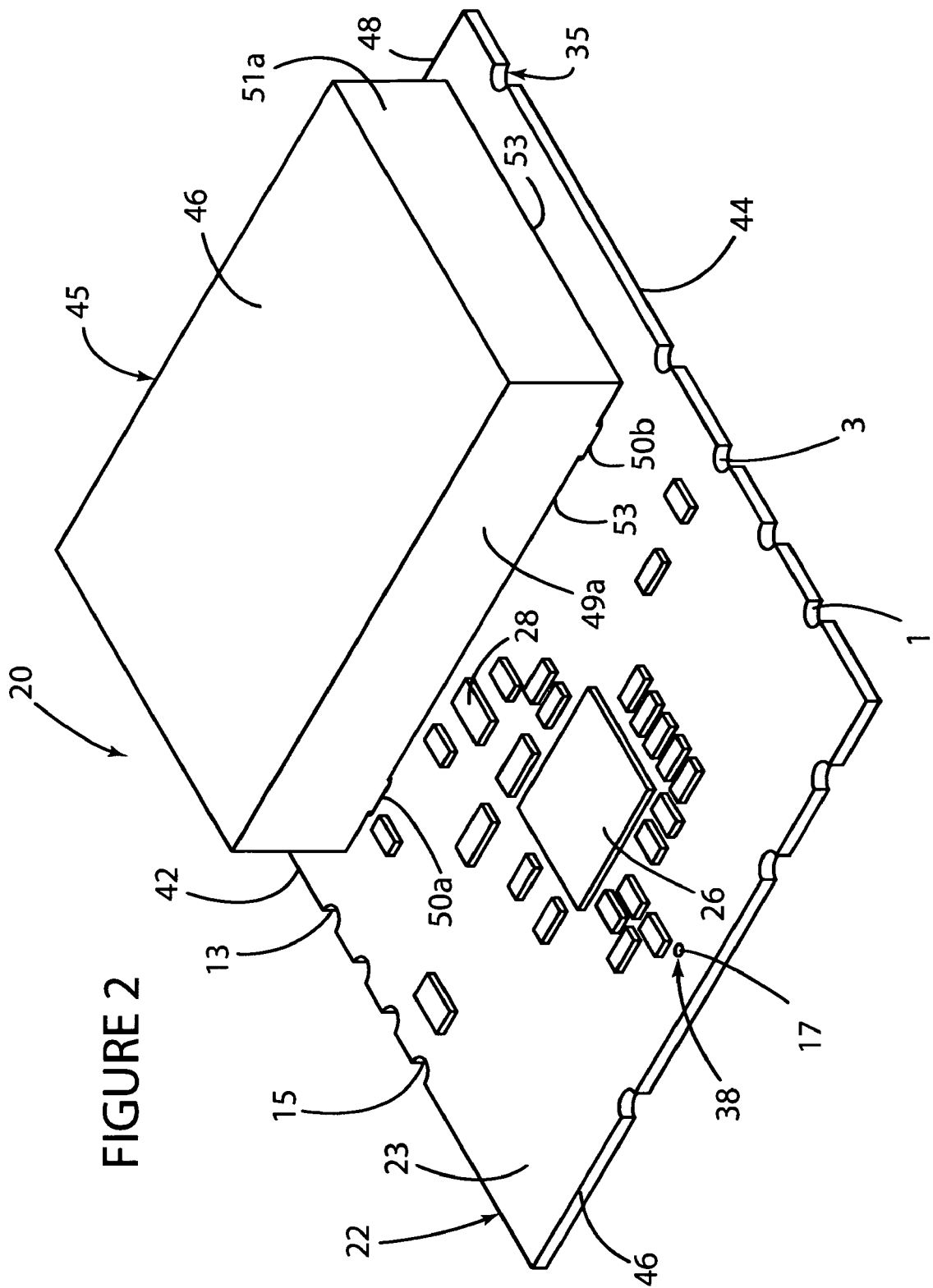
FIG. 2 is an enlarged simplified perspective view of a time division duplex front end module in accordance with the present invention.
Figure 3:
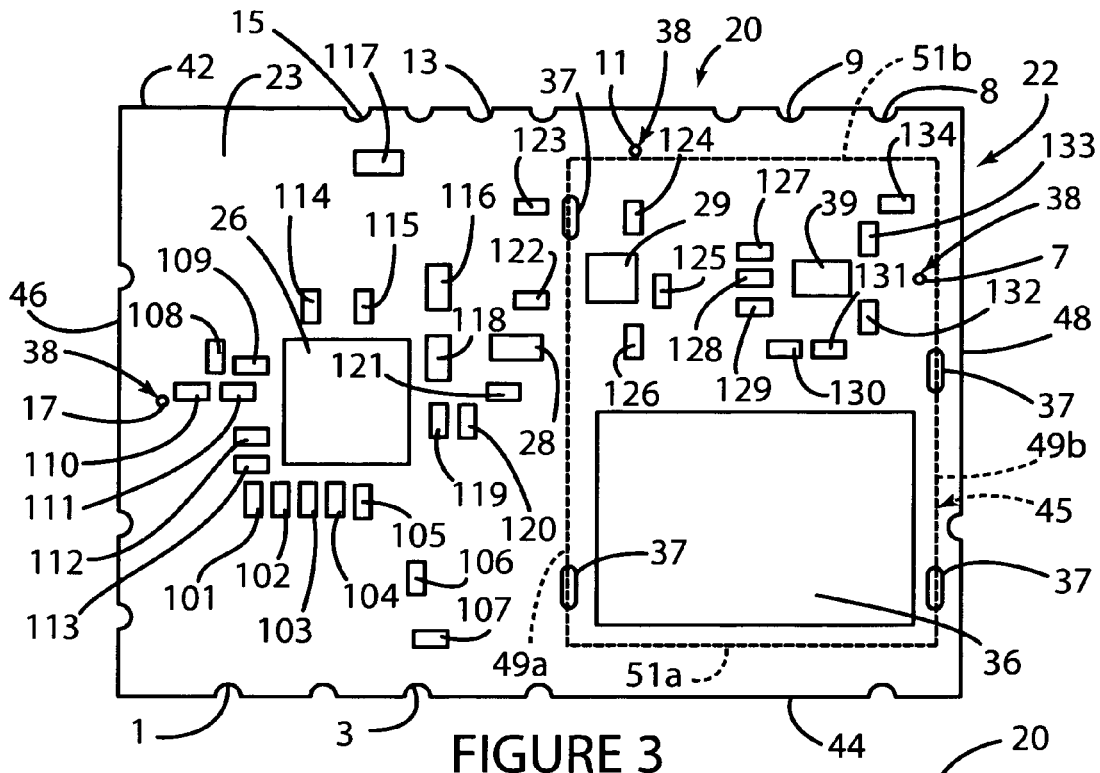
FIG. 3 is an enlarged simplified plan view of the front or top surface of the printed circuit board of the front end module of the present invention with the lid removed therefrom.
Figure 4:
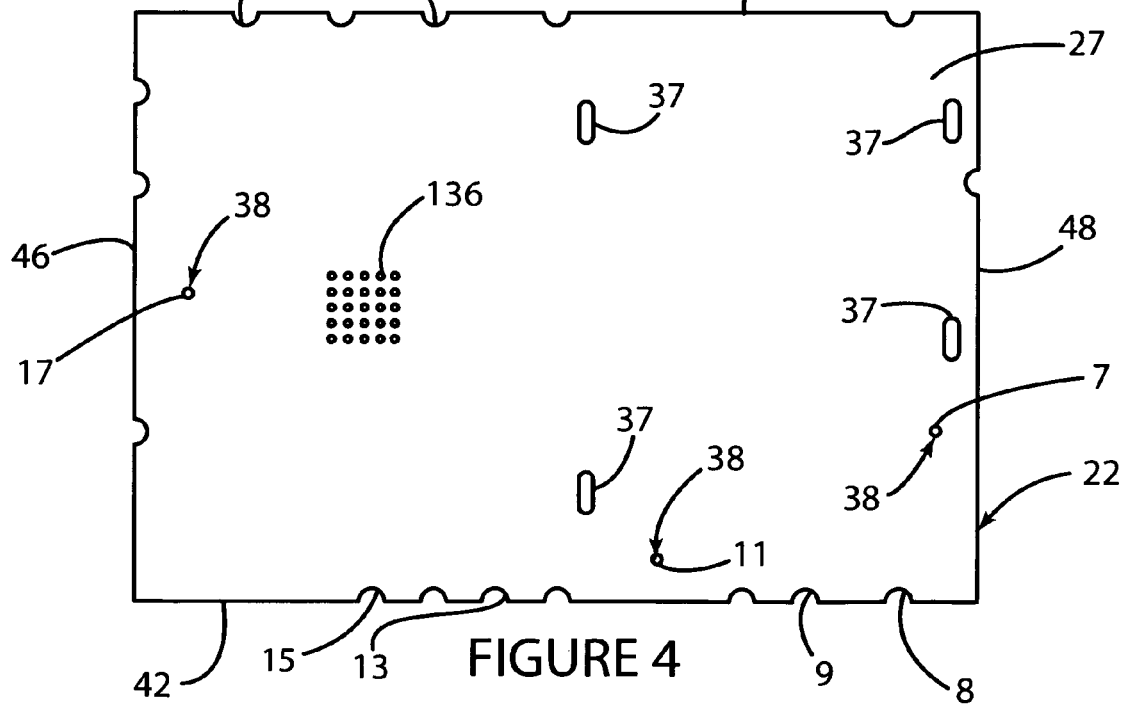
FIG. 4 is an enlarged simplified plan view of the back or bottom surface of the printed circuit board of the front end module of the present invention.

FIGS. 2-4 depict one simplified embodiment of a module 20 adapted and structured to be direct surface mounted to the front end of a WiMax TDD (time division duplex) femtocell, picocell, or microcell. It is understood, however, that the module embodiment of FIGS. 2-4 differs from the module embodiment of FIG. 1 in that, in the FIGS. 2-4 embodiment, PA power is detected through the use of a VDET pin 3 instead of a coupler as in the FIG. 1 embodiment.

By way of background, it is understood that module 20 of the present invention as depicted in FIGS. 2-4 measures about 19.0 mm in width, 27.0 mm in length, and 6.0 mm max. in height (with the lid secured thereon), and is adapted to be mounted to the motherboard of a WiMax picocell measuring about 8 inches by 18 inches which, as described above, is adapted for use as a wireless signal transfer base station inside a building such as a shopping mall or office complex.

In accordance with the present invention and referring to FIGS. 2-4, module 20 initially comprises a printed circuit board or substrate 22 which, in the embodiment shown, is preferably made of multiple layers of GETEK® or the like dielectric material and is about 1 mm (i.e., 0.040 inches) in thickness. Although not shown in any of the FIGURES, it is understood that predetermined regions of both the upper and lower surfaces 23 and 27 of the substrate 22 are covered with copper or the like material and solder mask material, both of which have been applied thereto and/or selectively removed therefrom as is known in the art to create the desired copper, dielectric, and solder mask regions and electrical circuits which interconnect the various electrical components. The metallization system is preferably ENIG, electroless nickel/immersion gold over copper.

A lid 45 (FIG. 2), which is adapted to cover a portion of the top surface 23 of the printed circuit board 22, is preferably brass with a Cu/Ni/Sn (copper/nickel/tin) plated material for ROHS compliance purposes. Lid 45 is adapted to act both as a dust cover and a Faraday shield.

As described above, generally rectangularly-shaped substrate 22 has top or front surface 23 (FIGS. 2 and 3), a bottom or back surface 27 (FIG. 4), and an outer peripheral circumferential edge defining respective upper and lower faces or edges 42 and 44 and side faces or edges 46 and 48 (FIGS. 2-5). Although not described in any detail, it is understood that, in a preferred embodiment, substrate 22 will be comprised of a plurality of stacked laminate layers of suitable dielectric material sandwiched between respective layers of conductive material as is known in the art such as, for example, a bottom RF ground plane layer, an RF intermediate signal layer, a top RF ground layer, and a topmost DC/RF layer plus ground layer.

Castellations 35 (FIGS. 2-4) are defined and located about the outer peripheral edge of board 22. Castellations 35 define the various ground and DC voltage input/output pins of the module 20. Castellations 35 are defined by metallized semicircular grooves which have been carved out of the respective edges 42, 44, 46 and 48 and extend between the respective top and bottom surfaces 23 and 27 of the substrate 22. In the embodiment shown, the castellations 35 are defined by plated through-holes which have been cut in half during manufacturing of the substrates from an array. Castellations 35 extend along the length of the respective edges of substrate 22 in spaced-apart and parallel relationship. In the embodiment shown, the top substrate edge 42 defines seven spaced-apart castellations 35, the lower substrate edge 44 defines five spaced-apart castellations 35, the side substrate edge 46 defines three castellations 35, and the opposed side substrate edge 48 defines one castellation 35.

The outer surface of each of the respective castellations 35 is coated as by electroplating or the like, with a layer of copper or the like conductive material which is initially applied to all of the surfaces of the substrate 22 during the manufacturing of the substrate 22 as is known in the art and then removed from selected portions of the surfaces to define the copper coated castellations 35. Castellations 35 and, more specifically, the copper thereon creates an electrical path between top surface 23 and bottom or back surface 27 of substrate 22.

Although not shown, it is understood that the copper extends around both the top and bottom edges of each of the castellations 35 to define pads of copper or the like conductive material on the top surface 23 of substrate 22 and surrounding the top or front edge of each of the respective castellations 35; and a plurality of pads extending inwardly from the bottom or back edge of each of the castellations 35 on the bottom surface 27 of substrate 22 which allow the module 20 to be directly surface mounted by reflow soldering or the like, to corresponding pads located on the surface of the motherboard of the picocell (not shown).

Although not disclosed in any detail, it is understood that respective ones of the castellations define respective voltage input/output pins while other ones of the castellations 35 define pins adapted for direct coupling to the ground copper layer applied to both of the surfaces 23 and 27.

Conductive vias 38 defined in the board 22 define the respective RF component signal input/output and antenna pins 7, 11, and 17 of the module 20. Vias 38 extend through the substrate 22 between the substrate surfaces 23 and 27 thereof and, as known in the art, define an interior cylindrical surface which has been plated with copper or the like conductive material. In accordance with the present invention, the use of vias 38 which are spaced from the respective substrate edges instead of castellations 35 defined in respective substrate edges insures a constant 50-ohm characteristic impedance.

Pinouts 1 and 3 extend along the bottom longitudinal edge 44 of board 22. Pinout 7 extends along the side longitudinal edge 48. Pinouts 8, 9, and 13 extend along the top longitudinal edge 42 of board 22. Pinout 17 extends along the side longitudinal edge 46 of board 22.

With reference to FIGS. 2 and 3, power amplifier 26 (together with the other components which are part of the Tx signal path) is preferably located in an area of the printed circuit board 22 not intended to be covered by the lid 45, to allow for the dissipation of heat created by the amplifier 26 and also to reduce the transfer of heat created by the amplifier 26 to any of the electrical components located under the lid 45.

More specifically, it is understood that, in the preferred embodiment, power amplifier 26 is generally centrally located on the left hand half of the top or front surface 23 of the substrate/board 22. Pinout 13 extends generally opposite the top edge of power amplifier 26 along longitudinal board edge 42. Pinouts 1 and 3 extend generally along the bottom edge of power amplifier 26 along the length of bottom longitudinal board edge 44. Pinout 17 extends generally opposite the left side edge of power amplifier 26 along (but spaced inwardly from) board side edge 46.

In the embodiment shown, a first set of appropriate resistors and capacitors 101, 102, 103, 104, 105, 106, and 107 are all generally located and fixed on the top or front surface 23 of board 22 generally below the power amplifier 26 and, more specifically, between the power amplifier 26 and the lower longitudinal edge 44 of board 22.

A second set of appropriate resistors, capacitors, and inductors 108, 109, 110, 111, 112, and 113 are all generally located and fixed on the top or front surface 23 of the board 22 to the left of the power amplifier 26 and, more specifically, between the power amplifier 26 and the left side longitudinal edge 46 of the board 22.

A third set of appropriate resistors and capacitors 114, 115, 116, and 117 are all generally located and fixed on the top or front surface 23 of the board 22 generally above the top edge of power amplifier 26 and, more specifically, between the power amplifier 26 and the top longitudinal edge 42 of board 22.

Tx low pass filter 28 is located and fixed on the left half of the top or front surface 23 of the board 22 generally between the right side edge of the power amplifier 26 and the left edge of the lid 45.

A fourth set of appropriate resistors, capacitors and inductors 118, 119, 120, and 121 are all located and fixed on the top surface 23 of the board 22 generally between the power amplifier 26 and the Tx low pass filter 28.

Capacitors 122 and 123 are located the top surface 23 of the board 22 generally above Tx low pass filter 28 and, more specifically, between the Tx low pass filter 28 and the top longitudinal edge 42 of board 22.

RF switch 29, Rx bandpass filter 36, and Rx low noise amplifier 39 are all generally located on the right half of the board 22 and adapted to be located below the lid 45. More specifically, Rx bandpass filter 36 is seated on and covers a substantial portion of the lower portion of the right half of the top or front surface 23 of the board 22. RF switch 29 and Rx low noise amplifier 39 are both generally located above the Rx bandpass filter 36 and, more specifically, between the top longitudinal edge of the Rx bandpass filter 36 and the top longitudinal edge 42 of the board 22.

Pinout 7 extending along (but spaced inwardly from) the board side edge 48 is located generally opposite the right side edge of the Rx low noise amplifier 39. Pinout 11 extending along (but spaced inwardly from) the board top longitudinal edge 42 is located generally opposite the top edge of the RF switch 29.

Appropriate capacitors 124, 125, and 126 surround RF switch 29. Appropriate capacitors, resistors, and inductors 127, 128, 129, 130, 131, 132, 133, and 134 surround Rx low noise amplifier 39.

Referring to FIGS. 2 and 3, lid 45 includes a top wall or roof 46, a first pair of respective opposed side walls 49a and 49b, and a second pair of respective opposed side walls 51a and 51b, all adapted to depend and extend generally perpendicularly downwardly from the peripheral edges of the roof 46 to define the lid when the walls are folded during assembly. Each of the walls 49a, 49b, 51a and 51b in turn defines a lower longitudinal terminal edge 53. The edge 53 of each of the side walls 49a and 49b in turn defines at least two spaced-apart tabs 50a and 50b projecting downwardly therefrom and adapted to be fitted into respective through-slots or castellations 37 defined in the top surface 23 of the board 22 for locating and securing the lid 45 to the board 22 in a grounded relationship with the board 22 wherein the edges 53 of the respective lid walls 49a, 49b, 51a and 51b are seated over respective elongate ground strips (not shown) defined on the board top surface 23, thus providing and defining a grounded lid 45.

As also shown in FIG. 4, a plurality of through-holes or vias 136 are defined and formed on the board 22 beneath the region where the power amplifier 26 is seated on the board 22 to define a heat sink for the heat created by power amplifier 26. Through-holes 136 could be double-plated with copper or the like material for added thermal conductivity and likewise extend through the board 22.

The process for assembling a module 20 involves the following steps. After the substrate/board 22 has been fabricated, i.e., once all of the appropriate and desired copper castellations, copper strips, copper vias, copper pads, and copper through-holes have been formed thereon as known in the art, Ag/Sn (silver/tin) solder is screen printed onto a 2.6" by 4.6" printed circuit board array and, more particularly, onto the surface of each of the appropriate solder pads and strips defined on the array following the application of predetermined layers and strips of solder mask material as known in the art. Solder is applied to the surface of all of the designated copper strips, pads and regions and all of the desired and appropriate electrical components including all of the filters defining the module 20 are then appropriately placed and located on the array.

Although not described in any detail, it is understood that the particular selection, number, placement, and values of the appropriate resistors, capacitors, and inductors may vary depending upon the desired end application and performance characteristics of the module 20.

The lid 45 is then placed over the appropriate portion of the board 22 as described above into a soldered coupled relationship wherein the tabs 50a and 50b thereof are fitted into appropriate castellations/slots 37 defined in the board 22 thereby appropriately locating and securing the lid 45 to the board 22.

To complete the manufacturing process, the module 20 is then reflow soldered at a maximum temperature of 260° C. so as to couple all of the components and lid 45 to the board. Finally, the array is diced up as is known in the art and the individual modules 20 are then final tested and subsequently "taped and reeled" and readied for shipment.

While the invention has been taught with specific reference to an embodiment of the module adapted for use on the front end of a picocell, it is understood that someone skilled in the art will recognize that changes can be made in form and detail such as, for example, to the selection, number, placement, interconnection values, and patterns of the various RF elements and circuits, without departing from the spirit and the scope of the invention as defined in the appended claims. The described embodiment is to be considered in all respects only as illustrative of one embodiment and not restrictive.

What is claimed is:

1. A time division duplex RF module adapted for direct-surface mounting to the front end of the motherboard of a base station, the module comprising:

a substrate including top and bottom surfaces, a plurality of peripheral edges including castellations extending between the top and bottom surfaces of the substrate and defining at least voltage input/output pins, and a plurality of vias spaced from the plurality of peripheral edges and extending between the top and bottom surfaces of the substrate and defining at least RF signal input/output pins;

a first section on said substrate coupled to one of the plurality of vias and defining a transmit path for RF signals and including at least a discrete power amplifier;

a second section on said substrate coupled to another of the plurality of vias and defining a receive path for RF signals and including at least the following electrical components: a discrete receive bandpass filter and a discrete low-noise amplifier; and a discrete RF switch between and interconnecting said respective first and second sections to an antenna pin defined by yet another of the plurality of vias.

2. The time division duplex RF module of claim 1 further comprising a lid adapted to cover at least said receive bandpass filter and said low-noise amplifier but not said power amplifier.

3. An RF module adapted for direct surface mounting to a front end of a motherboard of a wireless base station and adapted to transmit and receive RF signals, the module comprising:

a substrate including opposed top and bottom surfaces wherein the top surface defines first and second halves, first and second opposed peripheral edges and third and fourth opposed peripheral edges, and first, second, and third RF signal input/output vias extending between the opposed top and bottom surfaces;

an RF signal transmit section on the top surface of the substrate including at least a power amplifier; and an RF signal receive section on the top surface of said substrate including at least a receive bandpass filter and a low-noise amplifier;

the module being characterized in that the RF signal transmit and receive sections are defined on the first and second halves of the top surface of the substrate respectively, the first and second RF signal input/output vias are defined on the first and second halves of the top surface of the substrate along the first and second opposed peripheral edges of the substrate respectively, and the third RF signal input/output via is defined between the first and second RF signal input/output vias along the third peripheral edge of the substrate.

4. The RF module of claim 3 further comprising a lid adapted to cover at least said RF signal receive section on the top surface of the substrate but not at least said power amplifier of said RF signal transmit section.

5. The RF module of claim 4, wherein at least said receive bandpass filter and said low-noise amplifier are located under said lid.

6. The RF module of claim 3, wherein said substrate defines a plurality of conductive through-holes located below said power amplifier.

7. The RF module of claim 3, wherein an RF switch is located on the top surface of the substrate between and interconnecting said respective RF signal transmit and receive sections and defines a time division duplex RF module.

8. An RF module adapted for direct surface mounting to a front end of a motherboard of a wireless base station, said module including a substrate having a plurality of electrical components mounted thereon and defining respective wireless signal transmit and receive sections thereon, the transmit section including at least a power amplifier mounted to the substrate, the RF module further including a lid which is mounted to the substrate and covers at least a portion of the receive section of the RF module but not at least the power amplifier of the transmit section of the RF module.

9. The RF module of claim 8 wherein the receive section includes at least a receive bandpass filter and the transmit section includes at least a transmit lowpass filter all direct surface mounted to said substrate of said module.

10. The RF module of claim 9 wherein the receive section further includes a low-noise amplifier direct surface mounted to said substrate of said module.

11. The RF module of claim 10 further including an RF switch mounted on the substrate and interconnected to both the transmit and receive sections to define a time division duplex RF module.

* * * * *